(12) United States Patent
Kobayashi et al.

(10) Patent No.: US 8,355,624 B2
(45) Date of Patent: Jan. 15, 2013

(54) SUSCEPTOR FOR HEAT TREATMENT AND HEAT TREATMENT APPARATUS

(75) Inventors: Ippei Kobayashi, Kyoto (JP); Yoshio Ito, Kyoto (JP); Akio Wada, Kyoto (JP); Kenichi Yokouchi, Kyoto (JP)

(73) Assignee: Dainippon Screen Mfg. Co., Ltd. (JP)

( * ) Notice: Subject to any disclaimer, the term of this patent is extended or adjusted under 35 U.S.C. 154(b) by 147 days.

(21) Appl. No.: 11/832,682

(22) Filed: Aug. 2, 2007

(65) Prior Publication Data

US 2008/0037964 A1 Feb. 14, 2008

(30) Foreign Application Priority Data

Aug. 10, 2006 (JP) .................................. 2006-218211

(51) Int. Cl.
*A21B 2/00* (2006.01)
(52) U.S. Cl. .......................... 392/416; 392/407; 392/418
(58) Field of Classification Search .................. 392/416, 392/407, 418
See application file for complete search history.

(56) References Cited

U.S. PATENT DOCUMENTS

| | | | |
|---|---|---|---|
| 5,643,483 | A | 7/1997 | Kubota et al. |
| 6,856,762 | B2 | 2/2005 | Kusuda et al. ................. 392/416 |
| 2002/0006678 | A1* | 1/2002 | Inazumachi et al. ............ 438/20 |
| 2006/0291835 | A1 | 12/2006 | Nozaki et al. |

FOREIGN PATENT DOCUMENTS

| JP | 59-178718 | 10/1984 |
|---|---|---|
| JP | 7-280462 | 10/1995 |
| JP | 2000-315658 | 11/2000 |
| JP | 2002-110579 | 4/2002 |
| JP | 2002-110580 | 4/2002 |
| JP | 2004-140318 | 5/2004 |
| JP | 2005-005667 | 1/2005 |
| JP | 2005-142529 | 6/2005 |

OTHER PUBLICATIONS

Office Action issued by the Japanese Patent Office on Apr. 17, 2012 in connection with corresponding Japanese Patent Application No. 2006-218211.
Partial Translation of Office Action issued by the Japanese Patent Office on Apr. 17, 2012 in connection with corresponding Japanese Patent Application No. 2006-218211.
Office Action issued by the Japanese Patent Office on Jan. 24, 2012 in connection with corresponding Japanese Patent Application No. 2006-218211.
Partial Translation of Office Action issued by the Japanese Patent Office on Jan. 24, 2012 in connection with corresponding Japanese Patent Application No. 2006-218211.

* cited by examiner

*Primary Examiner* — Thor Campbell
(74) *Attorney, Agent, or Firm* — Ostrolenk Faber LLP

(57) ABSTRACT

A susceptor for holding a semiconductor wafer to be flash-heated by a flash of light emitted from flash lamps is formed of transparent quartz. The susceptor has a backside surface only which is roughened by shot blasting to provide a ground-glass-like surface. When a flash of light is emitted, part of the flash of light emitted from the flash lamps and passing by a peripheral portion of the semiconductor wafer held by the susceptor into the susceptor reaches the ground-glass-like backside surface and is diffusely reflected therefrom. Part of the diffusely reflected light impinges on the peripheral portion of the semiconductor wafer held by the susceptor to thereby heat the low temperature regions which have appeared in the peripheral portion of the semiconductor wafer.

10 Claims, 5 Drawing Sheets

F I G . 4
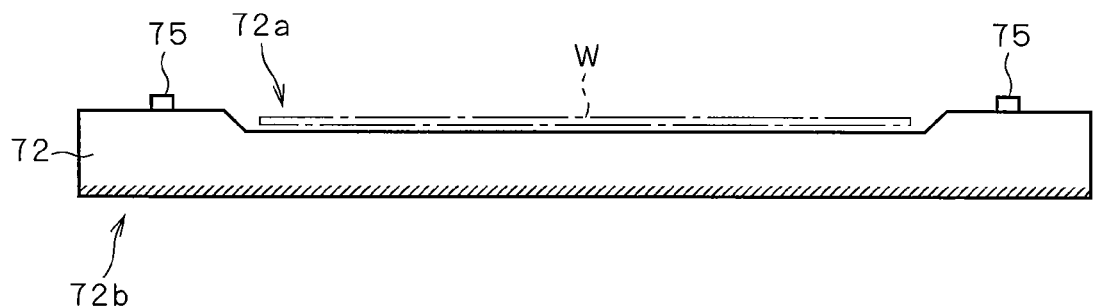

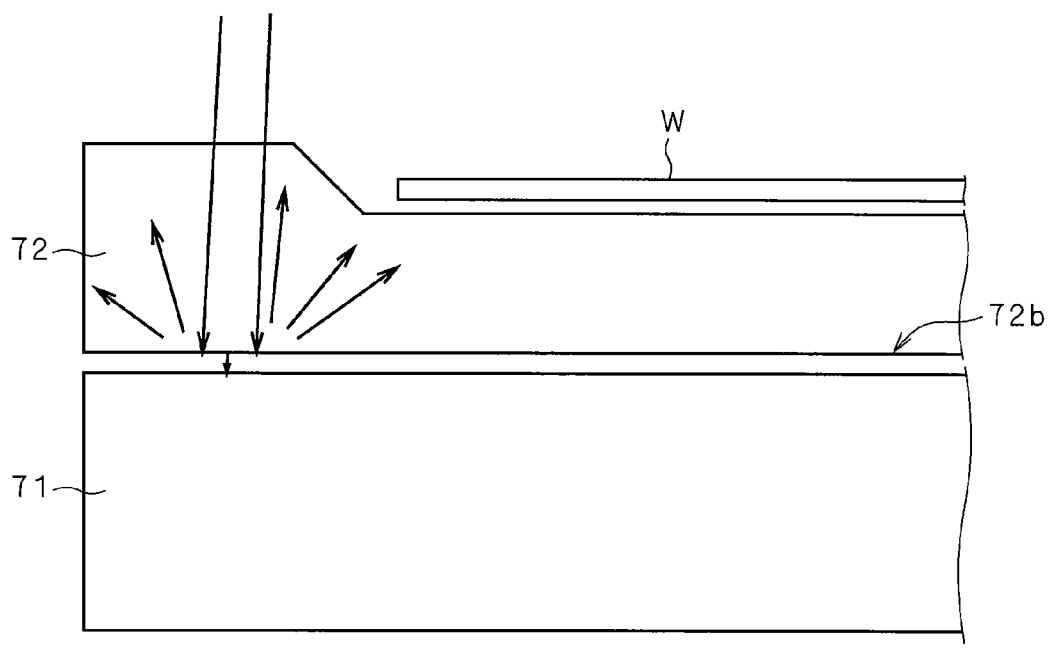
F I G . 6

SUSCEPTOR FOR HEAT TREATMENT AND HEAT TREATMENT APPARATUS

BACKGROUND OF THE INVENTION

1. Field of the Invention

The present invention relates to a heat treatment susceptor for holding a substrate including a semiconductor wafer, a glass substrate for a liquid crystal display device and the like which is to be heat-treated by being exposed to light during the heat treatment thereof, and a heat treatment apparatus provided with the heat treatment susceptor.

2. Description of the Background Art

Conventionally, a lamp annealer employing a halogen lamp has been typically used in the step of activating ions in a semiconductor wafer after ion implantation. Such a lamp annealer carries out the activation of ions in the semiconductor wafer by heating (or annealing) the semiconductor wafer to a temperature of, for example, about 1000° C. to about 1100° C. Such a heat treatment apparatus utilizes the energy of light emitted from the halogen lamp to raise the temperature of a substrate at a rate of about hundreds of degrees per second.

In recent years, with the increasing degree of integration of semiconductor devices, it has been desired to provide a shallower junction as the gate length decreases. It has turned out, however, that even the execution of the process of activating ions in a semiconductor wafer by the use of the above-mentioned lamp annealer which raises the temperature of the semiconductor wafer at a rate of about hundreds of degrees per second produces a phenomenon in which the ions of boron, phosphorus and the like implanted in the semiconductor wafer are diffused deeply by heat. The occurrence of such a phenomenon causes the depth of the junction to exceed a required level, giving rise to an apprehension about a hindrance to good device formation.

To solve the problem, there has been proposed a technique for exposing the surface of a semiconductor wafer to a flash of light by using a xenon flash lamp and the like to raise the temperature of only the surface of the semiconductor wafer implanted with ions in an extremely short time (several milliseconds or less). The xenon flash lamp has a spectral distribution of radiation ranging from ultraviolet to near-infrared regions. The wavelength of light emitted from the xenon flash lamp is shorter than that of light emitted from the conventional halogen lamp, and approximately coincides with a basic absorption band of a silicon semiconductor wafer. It is therefore possible to rapidly raise the temperature of the semiconductor wafer, with a small amount of light transmitted through the semiconductor wafer, when the semiconductor wafer is exposed to a flash of light emitted from the xenon flash lamp. Also, it has turned out that a flash of light emitted in an extremely short time of several milliseconds or less can achieve a selective temperature rise only near the surface of the semiconductor wafer. Therefore, the temperature rise in an extremely short time by using the xenon flash lamp allows the execution of only the ion activation without deeply diffusing the ions.

In a heat treatment apparatus employing such xenon flash lamps, the area in which the plurality of xenon flash lamps are arranged is much greater than the area of the semiconductor wafer. Nevertheless, the illuminance in a peripheral portion of the semiconductor wafer is somewhat lower than that in an inner portion thereof. In particular, a wafer having a diameter as large as 300 mm exhibits a large degree of lowering in illuminance in the peripheral portion thereof to result in the poor uniformity of a within-wafer illuminance distribution.

To solve such a problem, U.S. Pat. No. 6,856,762 discloses a heat treatment apparatus in which a geometrical pattern of ground glass is formed in a region of a diffuser provided between xenon flash lamps and a semiconductor wafer, the region being positioned over a portion (or inner portion) other than a peripheral portion of the semiconductor wafer. Thus, this heat treatment apparatus decreases the light transmittance of the region to decrease the illuminance in the inner portion of the semiconductor wafer during flash heating, consequently providing a uniform within-wafer illuminance distribution.

However, it has been found that a heat treatment apparatus employing a xenon flash lamp presents not only the non-uniformity of a temperature distribution in a radial direction of the semiconductor wafer but also the non-uniformity of a temperature distribution in a circumferential direction of the semiconductor wafer having the same radius. Specifically, there have been cases in which low temperature regions referred to as cold spots are formed only in part of the peripheral portion of the semiconductor wafer. For elimination of such non-uniformity of the temperature distributions, it is impossible to adjust the light source of the xenon flash lamp. It is also difficult for a hot plate for preheating the semiconductor wafer prior to the flash heating to eliminate the non-uniformity of the temperature distribution in the circumferential direction of the semiconductor wafer having the same radius.

SUMMARY OF THE INVENTION

The present invention is intended for a heat treatment apparatus for exposing a substrate to light to heat the substrate.

According to the present invention, the heat treatment apparatus comprises: a chamber for receiving a substrate therein; a susceptor having a frontside surface and a backside surface for holding the substrate on the frontside surface thereof within the chamber, the susceptor being formed of a transparent material, only the backside surface of the susceptor being a ground-glass-like substrate; and a light source for emitting light to expose the substrate held by the susceptor to the light.

Because only the backside surface of the susceptor is the ground-glass-like surface, the light passing by a peripheral portion of the substrate during the heat treatment is diffusely reflected from the backside surface, and part of the diffusely reflected light impinges on the peripheral portion of the substrate. This improves the within-wafer uniformity of a temperature distribution of the substrate during the heat treatment, especially the temperature distribution uniformity in the peripheral portion of the substrate.

Preferably, the light source includes a flash lamp for emitting a flash of light.

The flash of light passing by the peripheral portion of the substrate is diffusely reflected from the backside surface, and part of the diffusely reflected light impinges on the peripheral portion of the substrate. This improves the within-wafer uniformity of the temperature distribution of the substrate during the flash heat treatment, especially the temperature distribution uniformity in the peripheral portion of the substrate.

Preferably, the heat treatment apparatus further comprises a hot plate for placing the susceptor thereon to preheat the substrate through the susceptor before the flash lamp emits a flash of light.

This reduces the amount of the flash of light passing through the susceptor to reach the hot plate during the heat treatment, thereby to reduce damage to the hot plate.

The present invention is also intended for a heat treatment susceptor for holding a substrate to be heat-treated by being exposed to light during heat treatment.

According to the present invention, the heat treatment susceptor comprises: a main body part having a frontside surface and a backside surface, the main body part being formed of a transparent material; and a holding part formed on the frontside surface of the main body part for holding a substrate, the backside surface of the main body part being a ground-glass-like surface.

Because only the backside surface of the heat treatment susceptor is the ground-glass-like surface, the light passing by the peripheral portion of the substrate during the heat treatment is diffusely reflected from the backside surface, and part of the diffusely reflected light impinges on the peripheral portion of the substrate. This improves the within-wafer uniformity of the temperature distribution of the substrate during the heat treatment, especially the temperature distribution uniformity in the peripheral portion of the substrate.

It is therefore an object of the present invention to provide a heat treatment apparatus and a heat treatment susceptor which are capable of improving the within-wafer uniformity of a temperature distribution of a substrate during heat treatment, especially the temperature distribution uniformity in a peripheral portion of the substrate.

These and other objects, features, aspects and advantages of the present invention will become more apparent from the following detailed description of the present invention when taken in conjunction with the accompanying drawings.

BRIEF DESCRIPTION OF THE DRAWINGS

FIG. 4 is a sectional view of a susceptor in the heat treatment apparatus of FIG. 1;

FIG. 6 is a view showing the diffuse reflection of light from the backside surface of the susceptor.

DESCRIPTION OF THE PREFERRED EMBODIMENTS

A preferred embodiment according to the present invention will now be described in detail with reference to the drawings.

Figure 1:
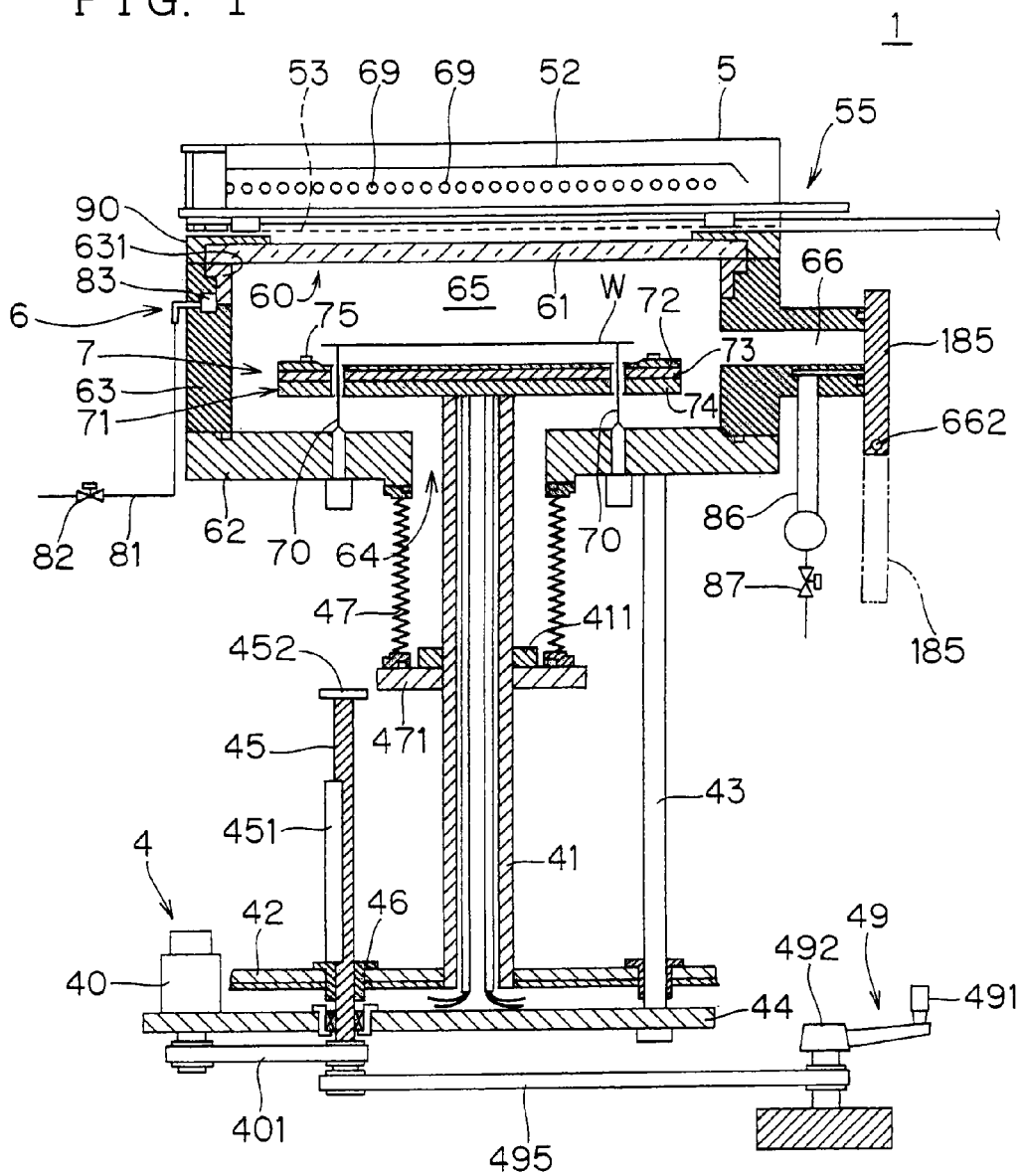
FIG. 1 is a side sectional view showing the construction of a heat treatment apparatus according to the present invention.

First, the overall construction of a heat treatment apparatus according to the present invention will be outlined. FIG. 1 is a side sectional view showing the construction of a heat treatment apparatus 1 according to the present invention. The heat treatment apparatus 1 is a flash lamp annealer for exposing a generally circular semiconductor wafer W serving as a substrate to a flash of light to heat the semiconductor wafer W.

The heat treatment apparatus 1 includes a chamber 6 of a generally cylindrical configuration for receiving a semiconductor wafer W therein. The chamber 6 includes a chamber side portion 63 having an inner wall of a generally cylindrical configuration, and a chamber bottom portion 62 for covering a bottom portion of the chamber side portion 63. A space surrounded by the chamber side portion 63 and the chamber bottom portion 62 is defined as a heat treatment space 65. A top opening 60 is formed over the heat treatment space 65.

The heat treatment apparatus 1 further includes: a light-transmittable plate 61 serving as a closure member mounted in the top opening 60 for closing the top opening 60; a holding part 7 of a generally disk-shaped configuration for preheating a semiconductor wafer W while holding the semiconductor wafer W within the chamber 6; a holding part elevating mechanism 4 for moving the holding part 7 upwardly and downwardly relative to the chamber bottom portion 62 serving as the bottom surface of the chamber 6; a light emitting part 5 for directing light through the light-transmittable plate 61 onto the semiconductor wafer W held by the holding part 7 to heat the semiconductor wafer W; and a controller 3 for controlling the above-mentioned components to perform heat treatment.

The chamber 6 is provided under the light emitting part 5. The light-transmittable plate 61 provided in an upper portion of the chamber 6 is a disk-shaped member made of, for example, quartz, and functions as a chamber window for allowing light emitted from the light emitting part 5 to travel therethrough into the heat treatment space 65. The chamber bottom portion 62 and the chamber side portion 63 which constitute the main body of the chamber 6 are made of a metal material having high strength and high heat resistance such as stainless steel and the like. A ring 631 provided in an upper portion of the inner side surface of the chamber side portion 63 is made of an aluminum (Al) alloy and the like having greater durability against degradation resulting from exposure to light than stainless steel.

An O-ring provides a seal between the light-transmittable plate 61 and the chamber side portion 63 so as to maintain the hermeticity of the heat treatment space 65. Specifically, the O-ring is fitted between a lower peripheral portion of the light-transmittable plate 61 and the chamber side portion 63, and a clamp ring 90 abuts against an upper peripheral portion of the light-transmittable plate 61 and is secured to the chamber side portion 63 by screws, thereby forcing the light-transmittable plate 61 against the O-ring.

The chamber bottom portion 62 is provided with a plurality of (in this preferred embodiment, three) upright support pins 70 extending through the holding part 7 for supporting the lower surface (a surface opposite from a surface onto which light is directed from the light emitting part 5) of the semiconductor wafer W. The support pins 70 are made of, for example, quartz, and are easy to replace because the support pins 70 are fixed externally of the chamber 6.

The chamber side portion 63 includes a transport opening 66 for the transport of the semiconductor wafer W therethrough into and out of the chamber 6. The transport opening 66 is openable and closable by a gate valve 185 pivoting about an axis 662. An inlet passage 81 for introducing a processing gas (for example, an inert gas including nitrogen ($N_2$) gas, helium (He) gas, argon (Ar) gas and the like, or oxygen ($O_2$) gas and the like) into the heat treatment space 65 is formed on the opposite side of the chamber side portion 63 from the transport opening 66. The inlet passage 81 has a first end connected through a valve 82 to a gas supply mechanism not shown, and a second end connected to a gas inlet buffer 83 formed inside the chamber side portion 63. The transport opening 66 is provided with an outlet passage 86 for exhausting the gas from the interior of the heat treatment space 65. The outlet passage 86 is connected through a valve 87 to an exhaust mechanism not shown.

Figure 2:
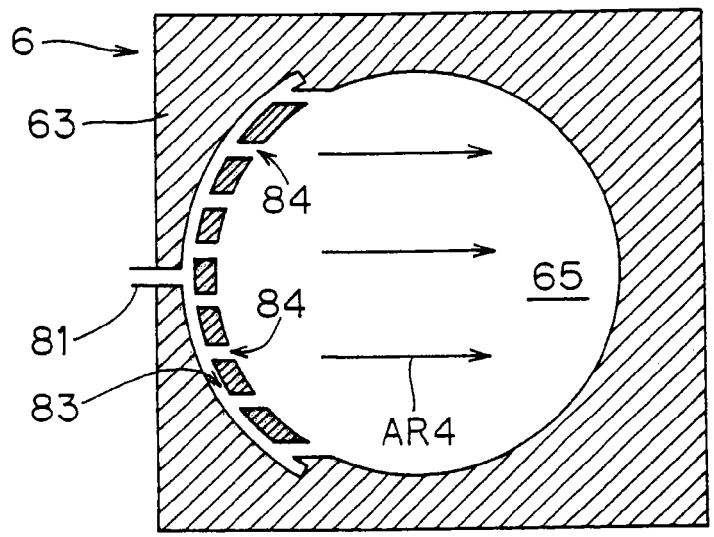
FIG. 2 is a sectional view showing a gas passage in the heat treatment apparatus of FIG. 1.

FIG. 2 is a sectional view of the chamber 6 taken along a horizontal plane at the level of the gas inlet buffer 83. As shown in FIG. 2, the gas inlet buffer 83 extends over approximately one-third of the inner periphery of the chamber side portion 63 on the opposite side from the transport opening 66 shown in FIG. 1. The processing gas introduced through the inlet passage 81 to the gas inlet buffer 83 is fed through a plurality of gas feed holes 84 into the heat treatment space 65.

The holding part elevating mechanism 4 shown in FIG. 1 includes a shaft 41 of a generally cylindrical configuration, a movable plate 42, guide members 43 (three guide members 43 are actually provided around the shaft 41 in this preferred embodiment), a fixed plate 44, a ball screw 45, a nut 46, and a motor 40. The chamber bottom portion 62 serving as the bottom portion of the chamber 6 is formed with a bottom opening 64 of a generally circular configuration having a diameter smaller than that of the holding part 7. The shaft 41 made of stainless steel is inserted through the bottom opening 64 and connected to the lower surface of the holding part 7 (a hot plate 71 of the holding part 7 in a strict sense) to support the holding part 7.

The nut 46 for threaded engagement with the ball screw 45 is fixed to the movable plate 42. The movable plate 42 is slidably guided by the guide members 43 fixed to the chamber bottom portion 62 and extending downwardly therefrom, and is vertically movable. The movable plate 42 is coupled through the shaft 41 to the holding part 7.

The motor 40 is provided on the fixed plate 44 mounted to the lower end portions of the respective guide members 43, and is connected to the ball screw 45 through a timing belt 401. When the holding part elevating mechanism 4 moves the holding part 7 upwardly and downwardly, the motor 40 serving as a driver rotates the ball screw 45 under the control of the controller 3 to move the movable plate 42 fixed to the nut 46 vertically along the guide members 43. As a result, the shaft 41 fixed to the movable plate 42 moves vertically, whereby the holding part 7 connected to the shaft 41 smoothly moves upwardly and downwardly between a transfer position shown in FIG. 1 in which the semiconductor wafer W is transferred and a treatment position shown in FIG. 5 in which the semiconductor wafer W is treated.

An upright mechanical stopper 451 of a generally semi-cylindrical configuration (obtained by cutting a cylinder in half in a longitudinal direction) is provided on the upper surface of the movable plate 42 so as to extend along the ball screw 45. If the movable plate 42 is to move upwardly beyond a predetermined upper limit because of any anomaly, the upper end of the mechanical stopper 451 strikes an end plate 452 provided at an end portion of the ball screw 45, whereby the abnormal upward movement of the movable plate 42 is prevented. This avoids the upward movement of the holding part 7 above a predetermined position lying under the light-transmittable plate 61, to thereby prevent a collision between the holding part 7 and the light-transmittable plate 61.

The holding part elevating mechanism 4 further includes a manual elevating part 49 for manually moving the holding part 7 upwardly and downwardly during the maintenance of the interior of the chamber 6. The manual elevating part 49 has a handle 491 and a rotary shaft 492. Rotating the rotary shaft 492 by means of the handle 491 causes the rotation of the ball screw 45 connected through a timing belt 495 to the rotary shaft 492, thereby moving the holding part 7 upwardly and downwardly.

An expandable/contractible bellows 47 surrounding the shaft 41 and extending downwardly from the chamber bottom portion 62 is provided under the chamber bottom portion 62, and has an upper end connected to the lower surface of the chamber bottom portion 62. The bellows 47 has a lower end mounted to a bellows lower end plate 471. The bellows lower end plate 471 is screw-held and mounted to the shaft 41 by a collar member 411. The bellows 47 contracts when the holding part elevating mechanism 4 moves the holding part 7 upwardly relative to the chamber bottom portion 62, and expands when the holding part elevating mechanism 4 moves the holding part 7 downwardly. When the holding part 7 moves upwardly and downwardly, the bellows 47 contracts and expands to maintain the heat treatment space 65 hermetically sealed.

The holding part 7 includes the hot plate (or heating plate) 71 for preheating (or assist-heating) the semiconductor wafer W, and a susceptor 72 provided on the upper surface (a surface on which the holding part 7 holds the semiconductor wafer W) of the hot plate 71. The shaft 41 for moving the holding part 7 upwardly and downwardly as mentioned above is connected to the lower surface of the holding part 7.

The hot plate 71 includes an upper plate 73 and a lower plate 74 both made of stainless steel. Resistance heating wires such as nichrome wires for heating the hot plate 71 are provided between the upper plate 73 and the lower plate 74, and an electrically conductive brazing metal containing nickel (Ni) fills the space between the upper plate 73 and the lower plate 74 to seal the resistance heating wires therewith. The upper plate 73 and the lower plate 74 have brazed or soldered ends.

Figure 3:
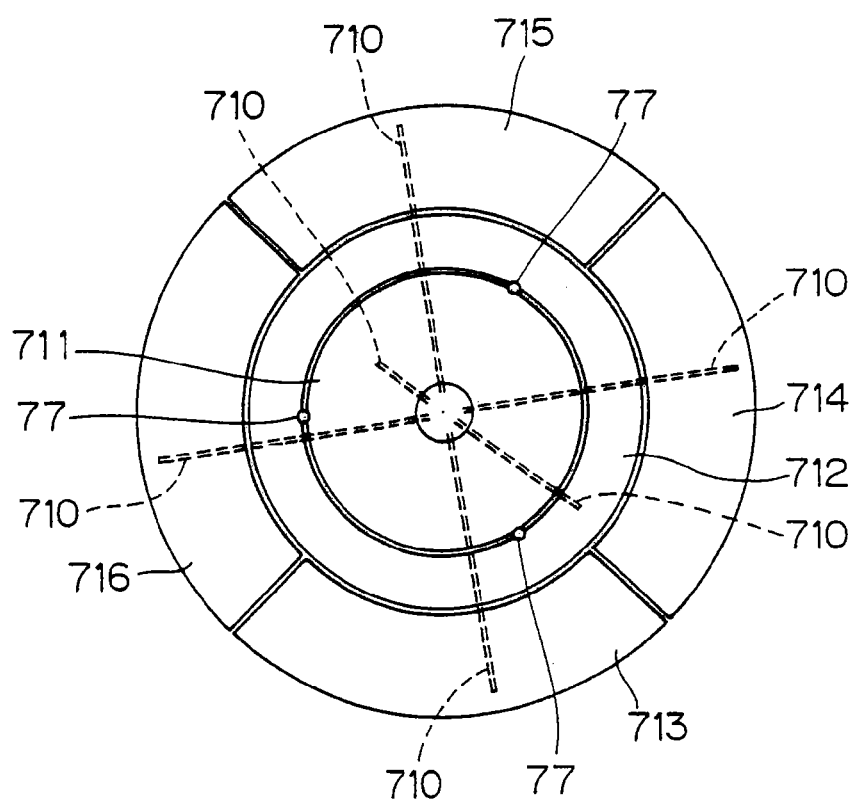
FIG. 3 is a plan view showing a hot plate in the heat treatment apparatus of FIG. 1.

FIG. 3 is a plan view of the hot plate 71. As shown in FIG. 3, the hot plate 71 has a circular zone 711 and an annular zone 712 arranged in concentric relation with each other and positioned in a central portion of a region opposed to the semiconductor wafer W held by the holding part 7, and four zones 713 to 716 into which a substantially annular region surrounding the zone 712 is circumferentially equally divided. Slight gaps are formed between these zones 711 to 716. The hot plate 71 is provided with three through holes 77 receiving the respective support pins 70 therethrough and circumferentially spaced 120° apart from each other in a gap between the zones 711 and 712.

In the six zones 711 to 716, the resistance heating wires independent of each other are disposed so as to make a circuit to form heaters, respectively. The heaters incorporated in the respective zones 711 to 716 individually heat the respective zones. The semiconductor wafer W held by the holding part 7 is heated by the heaters incorporated in the six zones 711 to 716. A sensor 710 for measuring the temperature of each zone by using a thermocouple is provided in each of the zones 711 to 716. The sensors 710 pass through the interior of the generally cylindrical shaft 41 and are connected to the controller 3.

For heating the hot plate 71, the controller 3 controls the amount of power supply to the resistance heating wires provided in the respective zones 711 to 716 so that the temperatures of the six zones 711 to 716 measured by the sensors 710 reach a previously set predetermined temperature. The temperature control in each zone by the controller 3 is PID (Proportional, Integral, Derivative) control. In the hot plate 71, the temperatures of the respective zones 711 to 716 are continually measured until the heat treatment of the semiconductor wafer W (the heat treatment of all semiconductor wafers W when the plurality of semiconductor wafers W are successively heat-treated) is completed, and the amounts of power supply to the resistance heating wires provided in the respective zones 711 to 716 are individually controlled, that is, the temperatures of the heaters incorporated in the respective zones 711 to 716 are individually controlled, whereby the temperatures of the respective zones 711 to 716 are maintained at the set temperature. The set temperature for the zones 711 to 716 may be changed by an individually set offset value from a reference temperature.

The resistance heating wires provided in the six zones 711 to 716 are connected through power lines passing through the interior of the shaft 41 to a power source (not shown). The power lines extending from the power source to the zones 711 to 716 are disposed inside a stainless tube filled with an insulator of magnesia (magnesium oxide) or the like so as to be electrically insulated from each other. The interior of the shaft 41 is open to the atmosphere.

FIG. 4 is a sectional view of the susceptor 72. The susceptor 72 is formed of a transparent material (a material transparent to a flash of light emitted from a xenon flash lamp in a strict sense). In this preferred embodiment, the susceptor 72 is formed of a quartz material having high durability against heat, producing a small amount of dust, and less susceptible to metal contamination. The material of the susceptor 72 may be other transparent ceramic materials. For example, aluminum nitride (AlN) or the like may be used as the material of the susceptor 72.

The susceptor 72 has a frontside surface formed with a wafer pocket 72a which is a recessed portion for holding the semiconductor wafer W therein. Pins 75 for preventing the semiconductor wafer W from shifting out of place are mounted on the outside of the wafer pocket 72a on the frontside surface of the susceptor 72.

The susceptor 72 has a backside surface 72b which is roughened to provide a ground-glass-like surface. Specifically, the surface roughening is carried out by shot blasting in such a manner that a blast of compressed air mixed with sand (abrasive grains) of Grain Size No. 320 defined by JIS (Japanese Industrial Standards) is blown against the backside surface 72b. This surface roughening process is performed on the entire backside surface 72b of the susceptor 72, but is not performed on other surfaces of the susceptor 72 than the backside surface 72b. That is, only the backside surface 72b of the susceptor 72 is roughened to provide the ground-glass-like surface. All of the surfaces of the susceptor 72 including the wafer pocket 72a except the backside surface 72b are polished to provide smooth surfaces.

The susceptor 72 is provided on the upper surface of the hot plate 71, with the backside surface 72b of the susceptor 72 in face-to-face contact with the upper surface of the hot plate 71. The semiconductor wafer W is held in the wafer pocket 72a of the susceptor 72 placed on the hot plate 71. Thus, the susceptor 72 diffuses heat energy from the hot plate 71 to transfer the heat energy to the semiconductor wafer W held in the wafer pocket 72a of the susceptor 72, and is removable from the hot plate 71 for cleaning during maintenance.

The light emitting part 5 shown in FIG. 1 is a light source including a plurality of (in this preferred embodiment, 30) xenon flash lamps (referred to simply as "flash lamps" hereinafter) 69, and a reflector 52. The plurality of flash lamps 69 each of which is a rodlike lamp having an elongated cylindrical configuration are arranged in a plane so that the longitudinal directions of the respective flash lamps 69 are in parallel with each other along a major surface of the semiconductor wafer W held by the holding part 7. The reflector 52 is provided over the plurality of flash lamps 69 to cover all of the flash lamps 69. The surface of the reflector 52 is roughened by abrasive blasting to produce a satin finish thereon. A light diffusion plate 53 (or a diffuser) is made of quartz glass having a surface subjected to a light diffusion process, and is provided on the lower surface side of the light emitting part 5, with a predetermined spacing held between the light diffusion plate 53 and the light-transmittable plate 61. The heat treatment apparatus 1 further includes an emitting part movement mechanism 55 for moving the light emitting part 5 upwardly relative to the chamber 6 and then for sliding the light emitting part 5 in a horizontal direction during maintenance.

Each of the xenon flash lamps 69 includes a glass tube containing xenon gas sealed therein and having positive and negative electrodes provided on opposite ends thereof and connected to a capacitor, and a trigger electrode wound on the outer peripheral surface of the glass tube. Because the xenon gas is electrically insulative, no current flows in the glass tube in a normal state. However, if a high voltage is applied to the trigger electrode to produce an electrical breakdown, electricity stored in the capacitor flows momentarily in the glass tube, and the Joule heat evolved at this time heats the xenon gas to cause light emission. The xenon flash lamps 69 have the property of being capable of emitting much intenser light than a light source that stays lit continuously because previously stored electrostatic energy is converted into an ultrashort light pulse ranging from 0.1 millisecond to 10 milliseconds.

The heat treatment apparatus 1 according to this preferred embodiment includes various cooling structures (not shown) to prevent an excessive temperature rise in the chamber 6 and the light emitting part 5 because of the heat energy generated from the flash lamps 69 and the hot plate 71 during the heat treatment of the semiconductor wafer W. As an example, the chamber side portion 63 and the chamber bottom portion 62 of the chamber 6 are provided with a water cooling tube, and the light emitting part 5 is provided with a supply pipe for supplying a gas to the interior thereof and an exhaust pipe with a silencer to form an air cooling structure. Compressed air is supplied to the gap between the light-transmittable plate 61 and the light diffusion plate 53 of the light emitting part 5 to cool down the light emitting part 5 and the light-transmittable plate 61 and to remove organic materials and the like present in the gap therefrom to suppress the deposition of the organic materials and the like onto the light diffusion plate 53 and the light-transmittable plate 61 during the heat treatment.

Next, a procedure for treating the semiconductor wafer W in the heat treatment apparatus 1 will be briefly described. The semiconductor wafer W to be treated herein is a semiconductor substrate doped with impurities by an ion implantation process. The activation of the implanted impurities is achieved by the heat treatment of the heat treatment apparatus 1.

First, the holding part 7 is placed in a position close to the chamber bottom portion 62, as shown in FIG. 1. The position of the holding part 7 shown in FIG. 1 within the chamber 6 is referred to hereinafter as a "transfer position." When the holding part 7 is in the transfer position, the upper ends of the support pins 70 protrude through the holding part 7 upwardly out of the holding part 7.

Next, the valve 82 and the valve 87 are opened to introduce nitrogen gas at room temperature into the heat treatment space 65 of the chamber 6. Subsequently, the transport opening 66 is opened, and a transport robot outside the apparatus transports the ion-implanted semiconductor wafer W through the transport opening 66 into the chamber 6 and places the semiconductor wafer W onto the plurality of support pins 70.

The amount of nitrogen gas fed into the chamber 6 during the transport of the semiconductor wafer W into the chamber 6 shall be about 40 liters per minute. The nitrogen gas fed in the chamber 6 flows from the gas inlet buffer 83 in a direction indicated by the arrows AR4 of FIG. 2, and is exhausted through the outlet passage 86 and the valve 87 shown in FIG. 1 by using a utility exhaust system. Part of the nitrogen gas fed into the chamber 6 is also exhausted from an exhaust port (not shown) provided inside the bellows 47. In steps to be described below, the nitrogen gas always continues to be fed into and exhausted from the chamber 6, and the amount of nitrogen gas fed into the chamber 6 is changed to various amounts in accordance with the process steps of the semiconductor wafer W.

Figure 5:
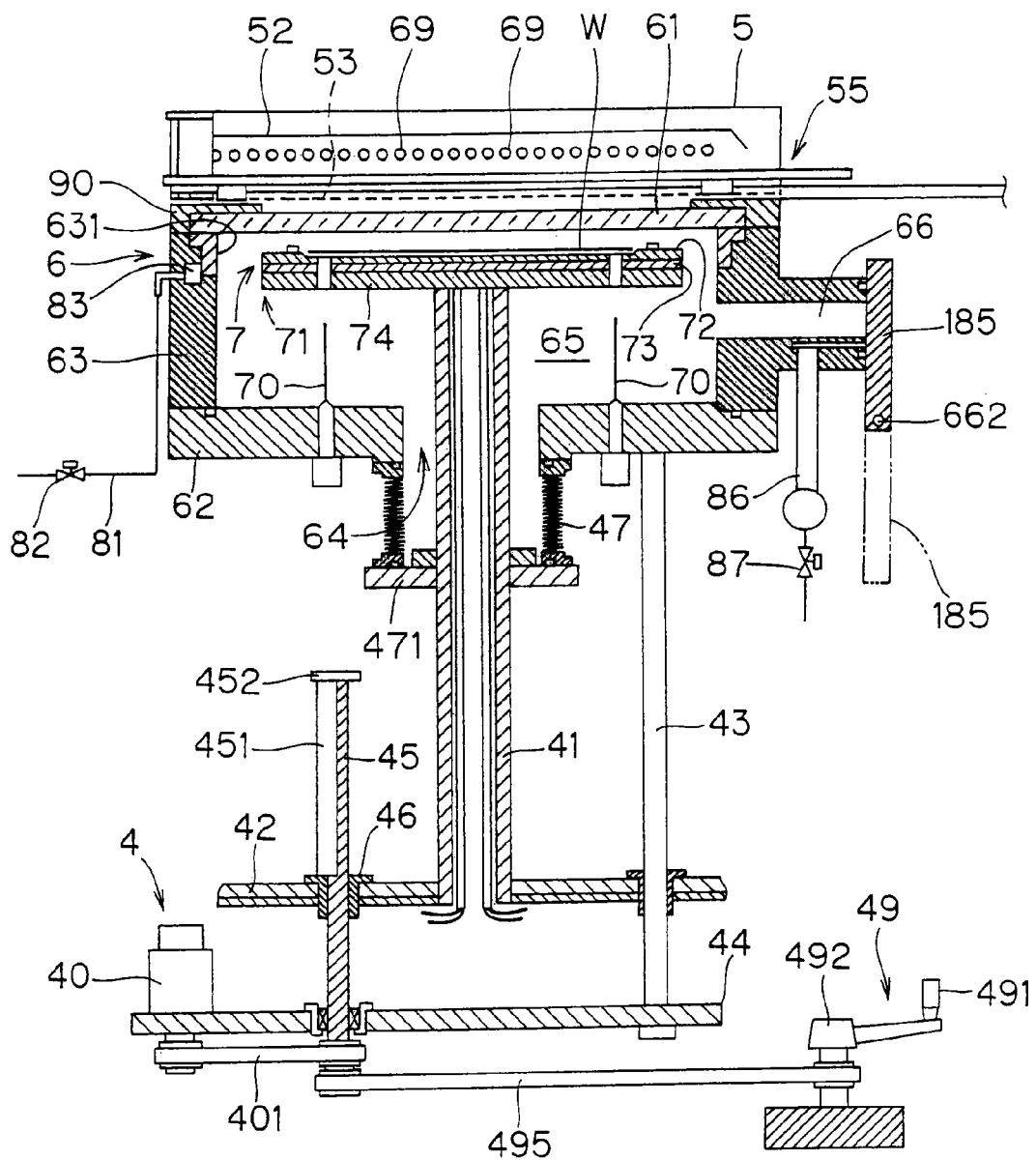
FIG. 5 is a side sectional view showing the construction of the heat treatment apparatus of FIG. 1.

After the semiconductor wafer W is transported into the chamber 6, the gate valve 185 closes the transport opening 66. Next, as shown in FIG. 5, the holding part elevating mechanism 4 moves the holding part 7 upwardly to a position (referred to hereinafter as a "treatment position") close to the light-transmittable plate 61. Then, the semiconductor wafer W is transferred from the support pins 70 to the susceptor 72 of the holding part 7, and is held by the wafer pocket 72a of the susceptor 72 within the chamber 6.

Each of the six zones 711 to 716 of the hot plate 71 is already heated up to a predetermined temperature by the resistance heating wire individually provided within each of the zones 711 to 716 (between the upper plate 73 and the lower plate 74). The holding part 7 is moved upwardly to the treatment position and the semiconductor wafer W comes in contact with the holding part 7, whereby the semiconductor wafer W is preheated through the susceptor 72 by the hot plate 71 and the temperature of the semiconductor wafer W increases gradually.

Preheating the semiconductor wafer W in the treatment position for about 60 seconds increases the temperature of the semiconductor wafer W up to a previously set preheating temperature T1. The preheating temperature T1 shall range from about 200° C. to about 600° C., preferably from about 350° C. to about 550° C., at which there is no apprehension that the impurities implanted in the semiconductor wafer W are diffused by heat. A distance between the holding part 7 and the light-transmittable plate 61 is adjustable to any value by controlling the amount of rotation of the motor 40 of the holding part elevating mechanism 4.

After a lapse of the preheating time of about 60 seconds, a flash of light is emitted from the light emitting part 5 toward the semiconductor wafer W under the control of the controller 3 while the holding part 7 remains in the treatment position. Part of the light emitted from the flash lamps 69 of the light emitting part 5 travels directly to the interior of the chamber 6. The remainder of the light is reflected by the reflector 52, and the reflected light travels to the interior of the chamber 6. Such emission of the flash of light achieves the flash heating of the semiconductor wafer W. The flash heating, which is achieved by the emission of a flash of light from the flash lamps 69, can raise the surface temperature of the semiconductor wafer W in a short time.

Specifically, the flash of light emitted from the flash lamps 69 of the light emitting part 5 is an intense flash of light emitted for an extremely short period of time ranging from about 0.1 millisecond to about 10 milliseconds because the previously stored electrostatic energy is converted into such an ultrashort light pulse. The surface temperature of the semiconductor wafer W subjected to the flash heating by the emission of the flash of light from the flash lamps 69 momentarily rises to a treatment temperature T2 of about 1000° C. to about 1100° C. After the impurities implanted in the semiconductor wafer W are activated, the surface temperature decreases rapidly. Because of the capability of increasing and decreasing the surface temperature of the semiconductor wafer W in an extremely short time, the heat treatment apparatus 1 can achieve the activation of the impurities while suppressing the diffusion of the impurities implanted in the semiconductor wafer W due to heat. Such a diffusion phenomenon is also known as a round or dull profile of the impurities implanted in the semiconductor wafer W. Because the time required for the activation of the implanted impurities is extremely short as compared with the time required for the thermal diffusion of the implanted impurities, the activation is completed in a short time ranging from about 0.1 millisecond to about 10 milliseconds during which no diffusion occurs.

Preheating the semiconductor wafer W by the holding part 7 prior to the flash heating allows the emission of the flash of light from the flash lamps 69 to rapidly increase the surface temperature of the semiconductor wafer W up to the treatment temperature T2.

After waiting in the treatment position for about 10 seconds following the completion of the flash heating, the holding part 7 is moved downwardly again to the transfer position shown in FIG. 1 by the holding part elevating mechanism 4, and the semiconductor wafer W is transferred from the holding part 7 to the support pins 70. Subsequently, the gate valve 185 opens the transport opening 66 having been closed, and the transport robot outside the apparatus transports the semiconductor wafer W placed on the support pins 70 outwardly. Thus, the flash heating process of the semiconductor wafer W in the heat treatment apparatus 1 is completed.

As discussed above, the nitrogen gas is continuously fed to the chamber 6 during the heat treatment of the semiconductor wafer W in the heat treatment apparatus 1. The amount of nitrogen gas fed into the chamber 6 shall be about 30 liters per minute when the holding part 7 is in the treatment position, and be about 40 liters per minute when the holding part 7 is in other than the treatment position.

In the heat treatment apparatus 1 according to this preferred embodiment, only the backside surface 72b of the susceptor 72 is roughened to provide the ground-glass-like surface. In the conventional techniques, all of the surfaces, including the backside surface 72b, of a susceptor have been smooth surfaces. It has, however, been found that a flash of light directed toward a semiconductor wafer W held by such a conventional susceptor creates low temperature regions relatively lower in temperature than other regions in a peripheral portion of the semiconductor wafer W. Such low temperature regions are known as cold spots and cause a treatment failure. Conceivable factors responsible for the creation of non-uniform temperature regions such as the cold spots include the configuration of the chamber 6 which is substantially cylindrical but is not truly cylindrical because of the presence of the transport opening 66, the gas inlet buffer 83 and the like, and the configuration of the flash lamps 69 of the light emitting part 5 which are not point light sources but are rodlike lamps. That is, the cold spots are considered to appear in specific locations of the semiconductor wafer W because of geometrical factors inherent in the apparatus such as the configuration of the chamber 6 itself and the configuration and arrangement of the flash lamps 69. In the heat treatment apparatus 1 according to this preferred embodiment, it has been found that, if all of the surfaces of the susceptor are smooth surfaces, the cold spots appear in opposite edge portions of the peripheral portion of the semiconductor wafer W, the opposite edge portions being arranged in a direction in which the semiconductor wafer W is transported into and out of the chamber 6 (or in a direction perpendicular to the longitudinal direction of the flash lamps 69). It is extremely difficult to eliminate the cold spots appearing in parts of the peripheral portion of the semiconductor wafer W by the adjustment of the temperature of the hot plate 71.

As in this preferred embodiment, when only the backside surface 72b of the susceptor 72 is roughened to provide the ground-glass-like surface, the light emitted as a flash of light from the light emitting part 5 and passing by the peripheral portion of the semiconductor wafer W held by the susceptor 72 into the susceptor 72 reaches the ground-glass-like backside surface 72b and is diffusely reflected therefrom, as shown in FIG. 6. Part of the diffusely reflected light impinges on the peripheral portion of the semiconductor waver W held by the susceptor 72 to result in the elimination of the cold spots which have appeared in the peripheral portion of the semiconductor wafer W. This improves the within-wafer uniformity of a temperature distribution of the semiconductor wafer W during the flash heating, especially the temperature distribution uniformity in the peripheral portion of the wafer W.

In the heat treatment apparatus 1 according to this preferred embodiment, the susceptor 72 is placed on the upper surface of the hot plate 71. Because the backside surface 72b of the susceptor 72 is roughened to provide the ground-glass-like surface, the amount of light emitted as a flash of light from the light emitting part 5 and passing through the susceptor 72 onto the upper surface of the hot plate 71 is significantly reduced, as compared with that in the conventional techniques. This reduces damage to a region of the hot plate 71 particularly on the outside of the peripheral portion of the wafer W by the emission of the flash of light.

The susceptor 72 according to this preferred embodiment allows the flash of light to partly pass therethrough onto the upper surface of the hot plate 71. Part of the light, however, is reflected from the upper surface of the hot plate 71 and is then scattered by the backside surface of the susceptor 72. This amplifies the amount of light impinging upon the peripheral portion of the semiconductor wafer W.

The frontside surface of the susceptor 72, which is the smooth surface, prevents the production of dust resulting from the friction between the semiconductor wafer W and the wafer pocket 72a, and damage to the semiconductor wafer W.

While the preferred embodiment according to the present invention has been described hereinabove, the present invention is not limited to the above-mentioned specific embodiment. For example, although the shot blasting is used to roughen the backside surface 72b of the susceptor 72, thereby providing the ground-glass-like surface in the preferred embodiment described above, the technique for producing a ground-glass-like surface is not limited to the shot blasting, but a variety of known glass processing techniques may be employed. Examples of such glass processing techniques may include etching the backside surface 72b of the susceptor 72, and trapping a multiplicity of fine bubbles near the backside surface 72b in the susceptor 72.

Although the wafer pocket 72a of the susceptor 72 illustrated in FIG. 4 has a bottom surface parallel to the backside surface 72b, the bottom surface of the wafer pocket 72a may be of a concave or convex configuration from the viewpoint of preventing a crack in the wafer W when the wafer W is exposed to a flash of light. Irrespective of the configuration of the wafer pocket 72a, the formation of the backside surface 72b of the susceptor 72 as the ground-glass-like surface produces effects similar to those of the preferred embodiment described above.

Although the entire backside surface 72b of the susceptor 72 is the ground-glass-like surface in the preferred embodiment described above, the present invention is not limited to this. At least a region of the backside surface 72b of the susceptor 72 reached by a flash of light emitted from the light emitting part 5 and passing by the semiconductor wafer W held by the susceptor 72 into the susceptor 72 may be a ground-glass-like surface, whereby effects similar to those of the preferred embodiment described above are produced. In other words, the effect of the diffuse reflection is sufficiently produced by providing only the region of the backside surface 72b of the susceptor 72 reached by the flash of light as the ground-glass-like surface.

Although the 30 flash lamps 69 are provided in the light emitting part 5 according to the preferred embodiment described above, the present invention is not limited to this. Any number of flash lamps 69 may be provided.

The flash lamps 69 are not limited to the xenon flash lamps but may be krypton flash lamps.

The technique according to the present invention is applicable to a heat treatment apparatus which comprises the light emitting part 5 including other types of lamps (e.g., halogen lamps) in place of the flash lamps 69 and which heats the semiconductor wafer W by exposing the semiconductor wafer W to light emitted from the lamps. Also in this case, the light emitted from the lamps and entering the susceptor 72 is diffusely reflected from the ground-glass-like backside surface 72b of the susceptor 72 and then impinges upon the peripheral portion of the semiconductor wafer W. This consequently provides a uniform within-wafer illuminance distribution of the semiconductor wafer W.

The hot plate 71 is used as the assist-heating element in the preferred embodiment described above. However, a group of lamps (e.g., a plurality of halogen lamps) may be provided under the holding part 7 which holds the semiconductor wafer W to emit light therefrom, thereby achieving the assist-heating.

In the preferred embodiment described above, the ion activation process is performed by exposing the semiconductor wafer to light. The substrate to be treated by the heat treatment apparatus according to the present invention is not limited to the semiconductor wafer. For example, the heat treatment apparatus according to the present invention may perform the heat treatment on a glass substrate formed with various silicon films including a silicon nitride film, a polycrystalline silicon film and the like. As an example, silicon ions are implanted into a polycrystalline silicon film formed on a glass substrate by a CVD process to form an amorphous silicon film, and a silicon oxide film serving as an anti-reflection film is formed on the amorphous silicon film. In this state, the heat treatment apparatus according to the present invention may expose the entire surface of the amorphous silicon film to light to polycrystallize the amorphous silicon film, thereby forming a polycrystalline silicon film.

Another modification may be made in a manner to be described below. A TFT substrate is prepared such that an underlying silicon oxide film and a polysilicon film produced by crystallizing amorphous silicon are formed on a glass substrate and the polysilicon film is doped with impurities such as phosphorus or boron. The heat treatment apparatus according to the present invention may expose the TFT substrate to light to activate the impurities implanted in the doping step.

While the invention has been described in detail, the foregoing description is in all aspects illustrative and not restrictive. It is understood that numerous other modifications and variations can be devised without departing from the scope of the invention.

What is claimed is:

1. A heat treatment apparatus for exposing a substrate to light to heat the substrate, comprising:
   a chamber for receiving a substrate therein;
   a susceptor having a frontside surface and a backside surface for holding the substrate on the frontside surface thereof within said chamber, said susceptor being formed of a transparent material, wherein only a region of the backside surface of said susceptor reached by light emitted from the light source and passing by the substrate held by said susceptor into said susceptor has a rough surface, and a light source for emitting light to expose the substrate held by said susceptor to the light, wherein the rough surface of the backside surface of the susceptor is of a degree of roughness such that light passing by a peripheral portion of the substrate during heat treatment of the substrate is diffusely reflected from the backside surface, with part of the diffusely reflected light impinging on the peripheral portion of the substrate.

2. The heat treatment apparatus according to claim 1, wherein said light source includes a flash lamp for emitting a flash of light.

3. The heat treatment apparatus according to claim 2, further comprising a hot plate for placing said susceptor thereon to preheat the substrate through said susceptor before said flash lamp emits a flash of light.

4. The heat treatment apparatus according to claim 1, wherein the frontside surface of said susceptor is a smooth surface.

5. The heat treatment apparatus according to claim 1, wherein said susceptor is made of quartz.

6. A heat treatment susceptor for holding a substrate to be heat-treated by being exposed to light during heat treatment, comprising:

a main body part having a frontside surface and a backside surface, said main body part being formed of a transparent material; and a holding part formed on the frontside surface of said main body part for holding a substrate, said backside surface of said main body part having a degree of roughness greater than that of the frontside surface; wherein only a region of the backside surface of said main body part reached by light emitted and passing by the substrate held by said heat treatment susceptor into said heat treatment susceptor is a rough surface of a degree of roughness such that light passing by a peripheral portion of the substrate during heat treatment of the substrate is diffusely reflected from the backside surface, with part of the diffusely reflected light impinging on the peripheral portion of the substrate.

7. The heat treatment susceptor according to claim 6, wherein the frontside surface of said main body part is a smooth surface.

8. The heat treatment susceptor according to claim 6, wherein said main body part is made of quartz.

9. The heat treatment apparatus according to claim 1, wherein the roughness of the rough surface of the backside surface is of an extent such that said diffusely reflected light from the backside surface with part of the diffusely reflected light impinging on the peripheral portion of the substrate is sufficient to increase uniformity of a temperature distribution of the substrate and the peripheral portion of the substrate during the heat treatment.

10. The heat treatment susceptor according to claim 6, wherein the roughness of the rough surface of the backside surface is of an extent such that said diffusely reflected light from the backside surface, with part of the diffusely reflected light impinging on the peripheral portion of the substrate, is sufficient to increase uniformity of a temperature distribution of the substrate and the peripheral portion of the substrate during the heat treatment.

* * * * *